United States Patent [19]

Heim et al.

[11] Patent Number: 5,304,953
[45] Date of Patent: Apr. 19, 1994

[54] LOCK RECOVERY CIRCUIT FOR A PHASE LOCKED LOOP

[75] Inventors: Barry B. Heim; Michael W. Hodel, both of Mesa; Paul T. Hu, Tempe, all of Ariz.

[73] Assignee: Motorola, Inc., Schaumburg, Ill.

[21] Appl. No.: 80,012

[22] Filed: Jun. 1, 1993

[51] Int. Cl.⁵ .................... H03L 7/095; H03L 7/10
[52] U.S. Cl. ........................ 331/1 A; 331/8; 331/17; 331/25; 331/DIG. 2
[58] Field of Search .............. 331/1 A, 8, 17, 25, 331/DIG. 2

[56] References Cited

U.S. PATENT DOCUMENTS 4,940,951 7/1990 Sakamoto .................. 331/17 X
5,008,635 4/1991 Hanke et al. .................. 331/1 A

*Primary Examiner*—Siegfried H. Grimm
*Attorney, Agent, or Firm*—Bradley J. Botsch, Sr.

[57] ABSTRACT

A circuit (10) for providing recovery of a phase locked loop circuit when lock has been lost has been provided. The circuit includes a lock indicator circuit (24) for detecting when the phase locked loop circuit has lost lock on an input reference signal. When such loss has occurred, an override circuit (28) is rendered operative to decrease the voltage appearing at the input of a VCO within the phase locked loop thereby slowing down the frequency of the VCO and allowing the phase locked loop circuit to recover lock. Further, a logic circuit (30) detects when the voltage appearing at the input of the VCO has fallen below a predetermined threshold voltage and renders the override circuit non-operative.

4 Claims, 1 Drawing Sheet

LOCK RECOVERY CIRCUIT FOR A PHASE LOCKED LOOP

FIELD OF THE INVENTION

This invention relates to phase locked loops and, in particular, to a circuit for providing recovery when the phase locked loop circuit loses lock.

BACKGROUND OF THE INVENTION

Phase locked loop circuits are utilized in a myriad of applications for providing an output signal having a frequency that tracks the frequency of an input reference signal. The phase lock loop circuit typically includes a phase detector which is responsive to an input reference signal and a feedback signal for providing output signals to a charge pump circuit. The charge pump circuit subsequently provides an output voltage to a voltage controlled oscillator (VCO) thereby determining the frequency of the VCO. Optionally, the output of the VCO undergoes a frequency division via a divider network wherein the output of the divider network is the feedback signal to the phase detector.

Briefly, if the frequency of the reference signal is greater than the frequency of the feedback signal, the phase detector will provide an output signal to the charge pump circuit which has the effect of providing a voltage to the VCO to increase the output frequency of VCO. The output signal of the VCO is then fed back, via the divider network, and is again compared with the input reference signal. This process is continued until the input reference signal is substantially equal to the feedback signal.

However, the VCO is typically able to run faster than other circuitry in the phase locked loop. Further, if the VCO begins to outrun the feedback circuitry, the feedback signal will be lost causing the phase detector to further increase the speed of the VCO. Unfortunately, this condition results in the VCO running at its maximum frequency thereby inhibiting the phase lock loop from recovering its lock to the input reference signal.

Hence, there exists a need to provide a lock recovery circuit that detects when lock has been lost and to restore the phase lock loop to a phase locked condition.

BRIEF DESCRIPTION OF THE DRAWING

The sole figure is a detailed schematic/block diagram illustrating a lock recovery circuit for use in a phase lock loop in accordance with the present invention.

DETAILED DESCRIPTION OF THE DRAWINGS

Figure 1:
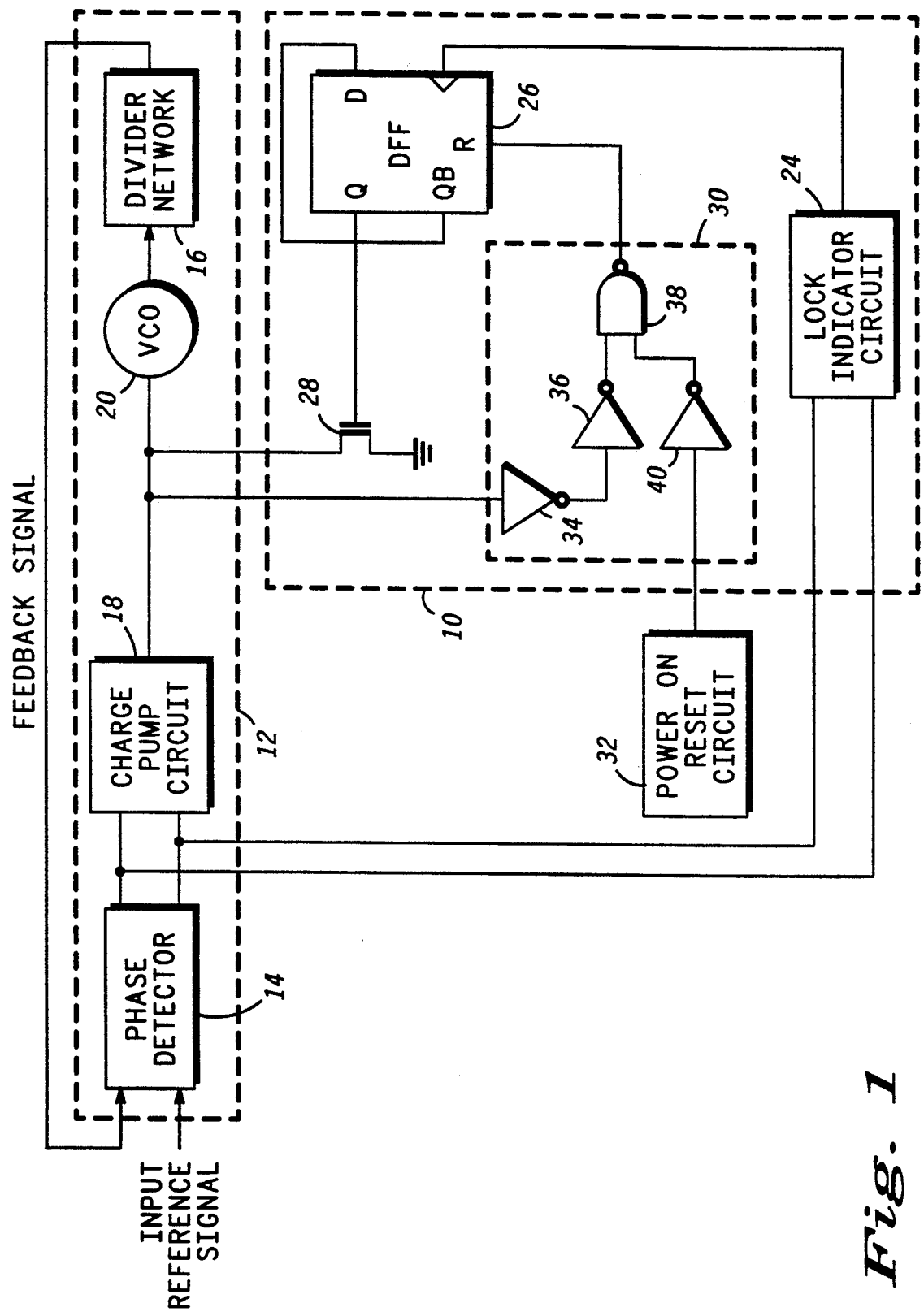

Referring to the sole figure, lock recovery circuit 10 for use with phase locked loop circuit 12 is shown. Phase lock loop circuit 12 includes phase detector 14 having a first input coupled to receive an input reference signal and a second input coupled to an output of divider network 16 which thereby provides a phase locked loop feedback signal.

Phase detector 14 has first and second outputs respectively coupled to first and second inputs of charge pump circuit 18. An output of charge pump circuit 18 is coupled to an input of VCO 20 the latter having an output coupled to an input of divider network 16.

Lock recovery circuit 10 includes lock indicator circuit 24 having first and second inputs respectively coupled to first and second outputs of phase detector 14. Lock indicator circuit 24 may take the form of the circuit disclosed in U.S. Pat. No. 5,008,635 having issue date of Apr. 16, 1991, the subject matter of which is incorporated herein by reference.

An output of lock indicator circuit 24 is coupled to a clock input of D-flipflop 26. D-flipflop 26 is coupled in a divide by two toggle mode wherein its data input (D) is coupled to its inverting output (QB). Further, a non-inverting output (Q) of D-flipflop 26 is coupled to a control electrode of override transistor 28. Override transistor 28 has a first current carrying electrode coupled to the output of charge pump circuit 18 and a second current carrying electrode returned to ground reference.

Lock recovery circuit 10 also includes logic circuitry 30 which has an input coupled to the output of charge pump circuit 18, and an output for providing an output signal to the reset input of D-flipflop 26. Logic circuitry 30 also includes an input that is coupled to an output of power on reset circuit 32 for receiving a power on reset signal.

Logic circuitry 30 includes override inverter 34 having an input coupled to the output of charge pump circuit 18 and an output coupled to input of inverter 36 the latter having an output coupled to a first input of NAND gate 38. Inverter 40 has an input coupled to receive a power on reset signal from power on reset circuit 32, and an output coupled to a second input of NAND gate 38. The output of NAND gate 38 is coupled to the reset input of D-flipflop 26.

In operation, upon power up, power on reset circuit 32 provides a reset signal, via inverter 40 and NAND gate 38, to the reset input of D-flipflop 26 thereby providing a logic low voltage level at the non-inverting output of D-flipflop 26 which has the effect of rendering override transistor 28 non-operative.

Once phase locked loop circuit 12 locks to the input reference signal, lock indicator circuit 24 detects such a lock and provides an output signal that is in a logic low state to the clock input of D-flipflop 26. In the course of operation, if phase locked loop 12 loses lock on the input reference signal, then lock indicator circuit 24 will detect this and provide an output signal that is in a logic high state. This logic low to high transition occurring at the output of lock indicator circuit 24 has the effect of clocking D-flipflop 26 which will result in a logic high appearing at the non-inverting output of D-flipflop 26 thereby rendering override transistor 28 operative.

Transistor 28 will function to discharge the voltage appearing at the input of VCO 20 thereby slowing the frequency of VCO 20 to an adequately low frequency so as to enable phase locked loop 12 to regain lock.

Logic circuit 30 functions to detect when the voltage appearing at the input of VCO 20 falls below a predetermined voltage and then resets D-flipflop 26. Further, once D-flipflop 26 is reset, its non-inverting output goes low thereby disabling transistor 28. In particular, when the voltage appearing at the input of VCO 20 falls below a predetermined threshold voltage, override inverter 34 will provide a logic high signal at its output wherein inverter 36 will subsequently provide a logic low signal at the first input of NAND gate 38. This has the effect of resetting D-flipflop 26 and will function to render override transistor 28 non-operative. As a result, lock recovery circuit 10 allows phase locked loop circuit 12 to recover phase lock without powering down the circuit.

By now it should be apparent from the foregoing discussion that a novel circuit for providing recovery of a phase locked loop circuit when lock has been lost has been provided. The circuit includes a lock indicator circuit for detecting when the phase locked loop circuit has lost lock on an input reference signal. When such loss has occurred, an override transistor is rendered operative to discharge the voltage appearing at the input of a VCO within the phase locked loop thereby slowing down the frequency of the VCO and allowing the phase locked loop circuit to recover lock. Further, a logic circuit detects when the voltage appearing at the input of the VCO has fallen below a predetermined threshold voltage and renders the override transistor non-operative.

While the invention has been described in specific embodiments thereof, it is evident that many alterations, modifications and variations will be apparent to those skilled in the art. Further, it is intended to embrace all such alterations, modifications and variations in the appended claims.

We claim:

1. A circuit for detecting when a phase locked loop loses lock and for allowing the phase locked loop to recover lock, the phased locked loop including a phase detector, a charge pump circuit, and a voltage controlled oscillator, the circuit comprising:

a lock indicator circuit having first and second inputs and an output, said first and second inputs of said lock indicator circuit being coupled to the phase detector;

a latch circuit having a clock input, a reset input and an output, said clock input of said latch circuit being coupled to said output of said lock indicator circuit;

an override circuit having an input and an output, said input of said override circuit being coupled to said output of said latch circuit, said output of said override circuit being coupled to the voltage controlled oscillator; and a logic circuit having an input and an output, said input of said logic circuit being coupled to the voltage controlled oscillator, said output of said logic circuit being coupled to said reset input of said latch circuit, said logic circuit being responsive to a power on reset signal for resetting said latch circuit.

2. The circuit according to claim 1 wherein said override circuit includes a transistor having first and second current carrying electrodes and a control electrode, said control electrode of said transistor being coupled to said output of said latch circuit, said first current carrying electrode of said transistor being coupled to the voltage controlled oscillator, said second current carrying electrode of said transistor being coupled to a first supply voltage terminal.

3. A lock recovery circuit for a phase locked loop, the phase locked loop including a phase detector, a charge pump circuit and a voltage controlled oscillator, the lock recovery circuit comprising:

first means for detecting when said phase locked loop is in a locked condition, said first means being coupled to the phase detector and having an output for providing an output signal;

second means for decreasing a voltage appearing at an input of the voltage controlled oscillator, said second means being coupled to the voltage controlled oscillator, said second means having an input;

third means for rendering said second means operative in response to said output signal of said first means, said third means having an input coupled to said output of said first means, said third means having an output coupled to said input of said second means; and fourth means for resetting said third means and thereby rendering said second means non-operative, said fourth means having an input coupled to the voltage controlled oscillator, said fourth means having an output coupled to said third means.

4. A method for allowing a phase locked loop to recover lock, the phase locked loop includes a phase detector, a charge pump circuit and a voltage controlled oscillator, the method comprising the steps of:

detecting when the phase locked loop loses lock;

decreasing a voltage appearing at an input of the voltage controlled oscillator when the phased locked loop looses lock thereby allowing the phase locked loop to recover lock;

detecting when said voltage appearing at said input of the voltage controlled oscillator falls below a predetermined threshold; and discontinuing decreasing said voltage appearing at said input of the voltage controlled oscillator circuit when said voltage falls below said predetermined threshold.

* * * * *